United States Patent
Turner

(10) Patent No.: US 9,575,104 B2
(45) Date of Patent: Feb. 21, 2017

(54) ESTIMATION OF RESISTANCE IN ELECTRICAL MACHINES

(71) Applicant: Nidec SR Drives Ltd., Harrogate, North Yorkshire (GB)

(72) Inventor: Michael James Turner, Whixley (GB)

(73) Assignee: NIDEC SR DRIVES LTD., Harrogate (GB)

(*) Notice: Subject to any disclaimer, the term of this patent is extended or adjusted under 35 U.S.C. 154(b) by 635 days.

(21) Appl. No.: 14/095,961

(22) Filed: Dec. 3, 2013

(65) Prior Publication Data

US 2014/0159754 A1 Jun. 12, 2014

(30) Foreign Application Priority Data

Dec. 11, 2012 (GB) .................................. 1222284.0

(51) Int. Cl.
  *G01R 27/08* (2006.01)
  *G01R 31/34* (2006.01)
  *G01K 7/16* (2006.01)

(52) U.S. Cl.
  CPC ................. *G01R 27/08* (2013.01); *G01K 7/16* (2013.01); *G01R 31/343* (2013.01); *G01R 31/346* (2013.01); *G01K 2217/00* (2013.01)

(58) Field of Classification Search
  CPC ..... G01R 27/08; G01R 31/343; G01R 31/346; G01K 7/16
  See application file for complete search history.

(56) References Cited

U.S. PATENT DOCUMENTS

| | | | |
|---|---|---|---|
| 4,083,001 A | 4/1978 | Paice | |
| 5,510,687 A | 4/1996 | Ursworth et al. | |
| 2008/0054835 A1* | 3/2008 | Tamaru | H02P 25/08 318/634 |
| 2012/0306422 A1 | 12/2012 | Hao et al. | |

FOREIGN PATENT DOCUMENTS

| | | |
|---|---|---|
| CN | 101029915 | 9/2007 |
| EP | 1677411 | 7/2006 |
| EP | 1858131 | 7/2010 |
| GB | 2075291 | 11/1981 |
| JP | 2005218275 | 8/2005 |
| WO | WO 2009/009232 | 1/2009 |

OTHER PUBLICATIONS

D. Panda et al., Accurate position estimation in switched reluctance motor with smooth starting, Proceedings of IEEE International Conference on Industrial Technology 2000, vol. 2, pp. 388-393, 2000.*
Low-pass filter, available Jun. 5, 2012 at http://en.wikipedia.org/wiki/Low-pass_filter.*
IEC 60034-1, "Rotating electrical machines—Part 1: Rating and performance", International Standard, Eleventh edition Apr. 2004, Section 8, pp. 71-101.

* cited by examiner

*Primary Examiner* — Daniel Miller
(74) *Attorney, Agent, or Firm* — Haynes and Boone, LLP

(57) ABSTRACT

In an electrical machine which has unidirectional excitation applied to its windings, the mean values of voltage and current can be computed from the instantaneous phase voltage and current by the use of, for example, low-pass filters (in either the analogue or digital domain). The value of winding resistance can then be calculated by dividing the mean voltage by the mean current. This avoids the cost, fragility and potential inaccuracy of conventional tempera- (Continued)

ture sensors, and provides the controller with an ongoing estimate of winding temperature.

18 Claims, 6 Drawing Sheets

ESTIMATION OF RESISTANCE IN ELECTRICAL MACHINES

CROSS-REFERENCE TO RELATED APPLICATIONS

This patent application claims the benefit of and priority to GB Patent Application No. 1222284.0 filed Dec. 11, 2012, which is incorporated herein by reference in its entirety.

TECHNICAL FIELD

The present disclosure relates to the estimation of phase winding resistance in electrical machines, particularly in those machines which are operated with unidirectional phase current.

BACKGROUND

While most electrical machines operate with alternating currents in their windings, some types of machine are operated with unidirectional current. These include DC machines and doubly salient reluctance machines. In general, a reluctance machine is an electrical machine in which torque is produced by the tendency of its movable part to move into a position where the reluctance of a magnetic circuit is minimised, i.e. where the inductance of the exciting winding is maximised. In some forms, circuitry is provided for detecting the angular position of the rotor and energising the phase windings as a function of the rotor position. This type of reluctance machine is generally known as a switched reluctance machine and it may be operated as a motor or a generator. A general treatment of electrical drives which incorporate switched reluctance machines can be found in various textbooks, e.g. "Electronic Control of Switched Reluctance Machines" by THE Miller, Newnes, 2001, incorporated herein by reference. The characteristics of such switched reluctance machines are well known and are described in, for example, "The Characteristics, Design and Application of Switched Reluctance Motors and Drives" by Stephenson and Blake, PCIM'93, Nürnberg, 21-24 Jun. 1993, incorporated herein by reference. That paper describes in some detail the features of the switched reluctance machine which together produce the characteristic cyclically varying inductance of the phase windings. It is well-known in the art that such machines can be operated in either the motoring or generating mode simply by altering the timing of the winding excitation.

FIG. 1 shows the principal components of a typical switched reluctance drive system, connected to a load 19. The input DC power supply 11 is typically derived from a battery or rectified and filtered AC mains and may be of fixed or variable voltage. The DC voltage provided by the power supply 11 is switched across the phase windings 16 of the motor 12 by a power converter 13 under the control of the electronic control unit 14. The switching must be correctly synchronised to the angle of rotation of the rotor for proper operation of the drive. A rotor position detector 15 is traditionally employed to supply signals indicating the angular position of the rotor. The output of the rotor position detector 15 may also be used to generate a speed feedback signal.

The energisation of the phase windings in a switched reluctance machine depends on detection of the angular position of the rotor. This may be explained by reference to FIGS. 2 and 3, which illustrate the switching of a reluctance machine operating as a motor. FIG. 2 generally shows a rotor pole 20 approaching a stator pole 21 generally in the direction indicated by arrow 22. As illustrated in FIG. 2, a portion 23 of a complete phase winding 16 is wound around the stator pole 21. When the portion 23 of the phase winding 16 around stator pole 21 is energised, a force will be exerted on the rotor, tending to pull rotor pole 20 into alignment with stator pole 21. FIG. 3 generally shows typical switching circuitry in the power converter 13 that controls the energisation of the phase winding 16, including the portion 23 around stator pole 21. The voltage busses 36, 37 are generally known as the DC link and the capacitor 35 across them is known as the DC link capacitor, whose function is to handle the alternating currents on the DC link. When switches 31 and 32 are closed, the phase winding is coupled to the source of DC power and is energised. When the phase winding of a switched reluctance machine is energised in the manner described above, the magnetic field set up by the flux in the magnetic circuit gives rise to the circumferential forces which, as described, act to pull the rotor poles into line with the stator poles.

In general, the phase winding is energised to effect the rotation of the rotor as follows. At a first angular position of the rotor (called the "turn-on angle", $\theta_{on}$), the controller 14 provides switching signals to turn on both switching devices 31 and 32. When the switching devices 31 and 32 are on, the phase winding is coupled to the DC link, causing an increasing magnetic flux to be established in the machine. The magnetic flux produces a magnetic field in the air gap which acts on the rotor poles to produce the motoring torque. The magnetic flux in the machine is supported by the magnetomotive force (mmf) which is provided by a current flowing from the DC supply 11 through the switches 31 and 32 and the phase winding 23. Current feedback is generally employed and the magnitude of the phase current is controlled by chopping the current by rapidly opening or closing one or both of switching devices 31 and/or 32. FIG. 4(a) shows a typical current waveform in the chopping mode of operation, where the current is chopped between two fixed levels. In motoring operation, the turn-on angle $\theta_{on}$ is often chosen to be the rotor position where the centre-line of an inter-polar space on the rotor is aligned with the centre-line of a stator pole, but may be some other angle. FIG. 4(a) also shows the form of the idealised inductance profile of the phase winding.

In many systems, the phase winding remains connected to the DC link (or connected intermittently if chopping is employed) until the rotor rotates such that it reaches what is referred to as the "freewheeling angle", $\theta_{fw}$. When the rotor reaches an angular position corresponding to the freewheeling angle (e.g., the position shown in FIG. 2) one of the switches, for example 31, is turned off. Consequently, the current flowing through the phase winding will continue to flow, but will now flow through only one of the switches (in this example 32) and through only one of the diodes 33/34 (in this example 34). During the freewheeling period, the voltage drop across the phase winding is small, and the flux remains substantially constant. The circuit remains in this freewheeling condition until the rotor rotates to an angular position known as the "turn-off angle", $\theta_{off}$, (e.g. when the centre-line of the rotor pole is aligned with that of the stator pole). When the rotor reaches the turn-off angle, both switches 31 and 32 are turned off and the current in phase winding 23 begins to flow through diodes 33 and 34. The diodes 33 and 34 then apply the DC voltage from the DC link in the opposite sense, causing the magnetic flux in the machine (and therefore the phase current) to decrease.

It is known in the art to use other switching angles and other current control regimes. Similarly, many other configurations of lamination geometry, winding topology and switching circuitry are known in the art, some of which are discussed in the Stephenson & Blake paper cited above.

As the speed of the machine rises, there is less time for the current to rise to the chopping level, and the drive is normally run in a "single-pulse" mode of operation. In this mode, the turn-on, freewheel and turn-off angles are chosen as a function of, for example, speed and load torque. Some systems do not use an angular period of freewheeling, i.e. switches 31 and 32 are switched on and off simultaneously. FIG. 4(b) shows a typical such single-pulse current waveform where the freewheel angle is zero. It is well known that the values of turn-on, freewheel and turn-off angles can be predetermined and stored in some suitable format for retrieval by the control system as required, or can be calculated or deduced in real time.

It will be noted that, in both the chopping and single-pulse modes of operation, the current in the phase winding is unidirectional. Mathematically, this can be represented by a zero-frequency component (so-called "DC component" or "mean value") and series of components at higher frequencies. This is an important distinction from other electrical machines where there is no DC component present.

Strictly speaking, the reference to a zero-frequency component above assumes steady-state operation at constant speed or output and winding temperature (with the average current drawn being constant). When operating conditions are not constant, the "zero-frequency" component will in effect be a low-frequency component with a frequency content determined at least in part by the time constant of changes in operating conditions. In any case, the frequency content of the "zero-frequency" or low-frequency component will be at significantly lower frequencies than the high-frequency components referred to above, which are due to factors such as the switching sequence of actuating the switches to energise the phase winding in question, as well as noise and other high frequency perturbation.

The phase current thus has a low-frequency component at least in part due to changing operating conditions, which has a frequency content below a notional limit frequency. In stable, steady state operation (eg constant speed, output and temperature), the low-frequency component is a substantially zero-frequency component, constant or time-invariant component. The phase current also has a high-frequency component at least in part due to switch actuation, above the notional limit frequency. For convenience of exposition, the terms "zero-frequency component", "DC component", "mean component", "mean value", "low-frequency component", "zero-frequency component", "constant component", "time invariant component" etc. are used interchangeably in what follows.

In the operation and control of electrical drive systems, a knowledge of the phase winding resistance is often desirable, if not essential. For example, many such systems incorporate methods of estimating the rotor position and many of these methods rely on an accurate measurement of resistance. In other systems, a limit is placed on the temperature at which the windings operate, so as to maintain an acceptable lifetime for the insulation system.

Since the windings are typically based on copper, which has a known temperature coefficient of resistance of around 0.0039, or aluminium, which has a known temperature coefficient of resistance of around 0.0043, it is possible to calculate the average temperature of the phase winding by measuring the resistance at a known temperature (typically an ambient temperature of 20° C.) and measuring or estimating the resistance at the elevated temperature. The procedure for doing this is incorporated in many standards and formal test methods, so that a consistent method of estimating temperature is obtained. For example, Section 8 of IEC 60034-1, "Rotating electrical machines—Part 1: Rating and Performance", is devoted to the determination of the thermal performance of machines and suggests the use of Equation 1 to determine the average winding temperature rise above ambient:

$$\theta_2 - \theta_a = (R_2 - R_1)/R_1 * (k + \theta_1) + \theta_1 - \theta_a \quad (1)$$

where
$\theta_1$ is the temperature (° C.) of the winding (cold) at the moment of the initial resistance measurement;
$\theta_2$ is the temperature (° C.) of the winding at the end of the thermal test;
$\theta_a$ is the temperature (° C.) of the coolant at the end of the thermal test;
$R_1$ is the resistance of the winding at temperature $\theta_1$ (cold);
$R_2$ is the resistance of the winding at the end of the thermal test;
k is the reciprocal of the temperature coefficient of resistance at 0° C. of the conductor material. (For copper k=235, for aluminium k=225.)

For small machines where the phase winding resistance is in the range, say, 10 to 100Ω, the resistance can be measured by multimeter-type laboratory instruments, whereas for larger machines with correspondingly lower resistances, the use of a four-terminal bridge (e.g. a Kelvin bridge) is generally required to give the required degree of accuracy.

This well-known "rise by resistance" technique for estimating winding temperatures in conventional machines (such as induction motors) requires that the machines be de-energised before resistance measurements are made. Furthermore, the inevitable presence of some electromagnetic saliency within the machine (even if only small, e.g. parasitic effects due to rotor bar geometry and slotting) means that the rotor must generally be brought to a complete standstill before dependable resistance measurements can be made. The traditional technique therefore involves shutting down the drive system, bringing the rotor to rest, plotting a curve of resistance versus time, extrapolating that curve back to the moment of switch-off, and then finally calculating a temperature rise based on the extrapolated value of resistance. Although it is the de facto standard method for gauging the thermal rating of industrial motors, this technique is not only cumbersome and error prone, but cannot be applied to the machine on an on-going basis during normal operation. Other sensing means (such as thermocouples, thermistors, etc.) are additionally required for monitoring winding temperatures whilst the machine is turning and/or energised. Such temperature sensors are often inaccurate (depending as they do on ill-defined thermal contact with the electrically-insulated windings) and may exhibit some time lag compared with the actual or true winding temperature. Furthermore, they require additional low-voltage (and therefore potentially fragile and sensitive) cabling and their additional cost may well be significant in the context of a mass-produced design. There is therefore a need for a non-intrusive and inexpensive means of obtaining an accurate measurement (or estimate) of winding temperature whilst the machine is turning and/or is energised.

Methods of compensating for change in resistance in the windings of other types of electrical machines are known. For example, U.S. Pat. No. 4,496,898 discloses a method of compensation for the temperature rise in the field winding of an ac generator. Methods of rotor resistance compensation in induction machines are known and commonly applied in so-called vector control systems. None of these schemes, however, are applicable to switched reluctance systems, since the effect of the change in resistance is unique to this genre of machine.

There is thus a need for a reliable and economic method of estimating the phase winding resistance of an electrical machine which can operate over all conditions of load (including transient load disturbances) and a wide range of ambient temperatures. The present disclosure is generally applicable to switched reluctance machines operating as motors or generators.

SUMMARY

Aspects of the disclosure are set out in the independent claims. Further, optional, features are set out in the remaining claims dependent thereon.

A first embodiment provides a method for estimating at least one of resistance and temperature of a winding of an electrical machine while the machine is operating. The method comprises energising the winding to cause a unidirectional current to flow in the winding to operate the machine. The unidirectional current and a resulting winding voltage across the winding each have a low frequency component with a frequency content below a limit frequency and a high frequency component with a frequency content above the limit frequency. The method comprises deriving first and second signals indicative of a magnitude of the low frequency component of, respectively, the winding voltage and the unidirectional current. The method further comprises deriving a third signal indicative of at least one of resistance and temperature of the winding using the first and second signals.

Advantageously, according to an embodiment, the method described above derives a resistance or temperature signal from the current used to operate the machine, rather than injecting an additional current for the purpose of estimating temperature or resistance. In other words, the method makes use of the unidirectional current inherent in the operation of the machine to estimate resistance or temperature.

A signal representative of the winding voltage for use in deriving the first signal may be, for example, measured across the winding using respective voltage sensing wires placed in proximity to each end of the winding; measured between the input and output of a switching circuit controlling energisation, ignoring resistance of the wiring to and from the winding or accounting for it using an estimate or measurement; estimated based on DC link voltage and switch timing (ignoring or estimating any voltage drop at times when one or both switches are open in a typical two-switch per phase arrangement), or obtained by any other suitable means. The third signal may, for example, be derived by dividing the first signal by the second signal, calculating a ratio of the two signals, or subtracting the first and second signals from each other if calculations are performed using logarithms. The above method is applicable whether the machine operates as a motor to produce a torque or as a generator to produce a charging current from a phase of the machine associated with the winding.

The limit frequency may, in some embodiments, not exceed the switching frequency of energisation of the winding, for example it may not exceed one tenth of the switching frequency. For example, the limit frequency may be less than 10 Hz, less than 1 Hz in some embodiments.

The first and second signals may be derived using low-pass filters. For example, the low-pass filters may be passive filters. The method may also comprise converting the first and second signals to respective digital signals and deriving the third signal using the digital signals. The first and second signals may be converted to digital signals after low-pass filtering. The first and second signals may instead be derived using digital processing, for example using digital filtering or a calculation of an average signal.

A further embodiment provides a drive system comprising an electrical machine with a winding, a controller configured to apply the excitation voltage, a voltage sensor, a current sensor and a temperature analyser coupled to the voltage and current sensors and configured to derive the first, second and third signals as described above.

The voltage sensor may be configured such that the sensed winding voltage may be measured across the winding using respective voltage sensing wires placed in proximity to each end of the winding; measured between the input and output of a switching circuit controlling energisation, ignoring resistance of the wiring to and from the winding or accounting for it using an estimate or measurement; estimated based on DC link voltage and switch timing (ignoring or estimating any voltage drop at times when one or both switches are open in a typical two-switch per phase arrangement), or obtained by any other suitable means.

In yet another embodiment, there is provided a system for estimating at least one of resistance and temperature of a winding of an electrical machine, comprising means for implementing a method as described above.

BRIEF DESCRIPTION OF THE DRAWINGS

The invention can be put into practice in a number of ways, some of which will now be described by way of example, with reference to the accompanying drawings in which.

DETAILED DESCRIPTION

The described embodiments take advantage of the fact that, in contrast to most conventional AC motors, there are some machines that have a substantial DC (i.e. zero frequency) component of winding current. One example is switched reluctance machines. This gives rise to a corresponding zero frequency component of winding voltage. These zero-frequency components (or mean values) can be computed from the instantaneous phase voltage and current by the use of low-pass filters (in either the analogue or digital domain). The DC value of winding resistance can then be calculated from Ohm's Law by dividing the mean voltage by the mean current. This avoids the cost, fragility and potential inaccuracy of conventional temperature sensors, and provides the controller with an ongoing and accurate estimate of average winding temperature. This may be used for example to automatically limit the machine's output in a "fold-back" capacity as a temperature limit is approached, and may also be advantageously used to improve estimates of, e.g., magnetic flux linkage in flux-controlled and/or sensor-less commutation schemes.

Figure 5:
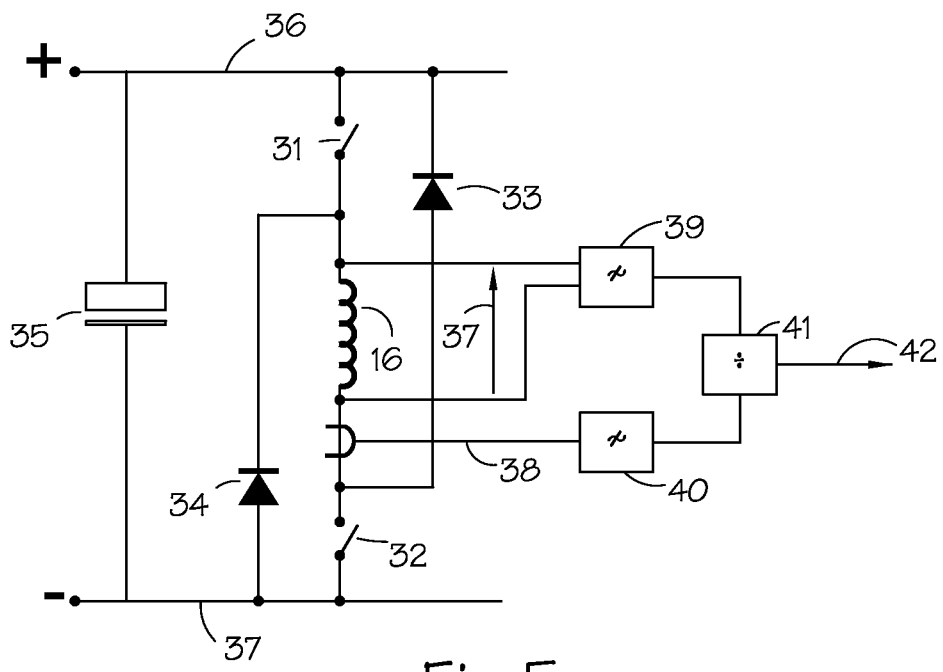
FIG. 5 shows a schematic diagram of one embodiment.

FIG. 5 illustrates one embodiment. Signals corresponding to the instantaneous winding voltage $V_{ph}(t)$ 37 and the instantaneous winding current $I_{ph}(t)$ 38 are obtained. For example a signal corresponding to $V_{ph}(t)$ could be obtained, at an appropriate scaling factor, using a differential amplifier or isolation amplifier. A signal corresponding to $I_{ph}(t)$ could be obtained using an isolated current sensor (based e.g. on Hall Effect or magneto-resistive principles—note that a response down to zero frequency is essential) or using a simple shunt resistor in combination with appropriate signal conditioning. It will be appreciated that such a resistor could be placed as shown in series with the machine winding.

The mean (or equivalently, the DC) components of the voltage and current signals are then obtained from low-pass filters 39,40, and the ratio is calculated by a divider 41 in order to obtain a signal corresponding to the estimated phase resistance 42. The filter cut-off frequencies and pole patterns are not critical, but typical values for the dominant time constant might be in the 0.1 second to 1 second range. The resulting filter cut-off frequency needs to be low enough to substantially suppress disturbance and fluctuation of the resistance estimate that would otherwise be caused by the AC components of winding voltage and current. On the other hand, the filter cut-off frequencies should not be so low that the response time is excessive (either from a convenience perspective if, say, providing a display of resistance or temperature, or relative to the maximum envisaged rate of change of winding temperature that the system is required to follow).

Finally, if an explicit temperature estimate $t_{ph}$ is required in some embodiments, this may be calculated as described above from the computed winding resistance $R_2$, together with a reference winding resistance $R_1$ that has been pre-determined at a reference temperature $\theta_1$.

Figure 6:
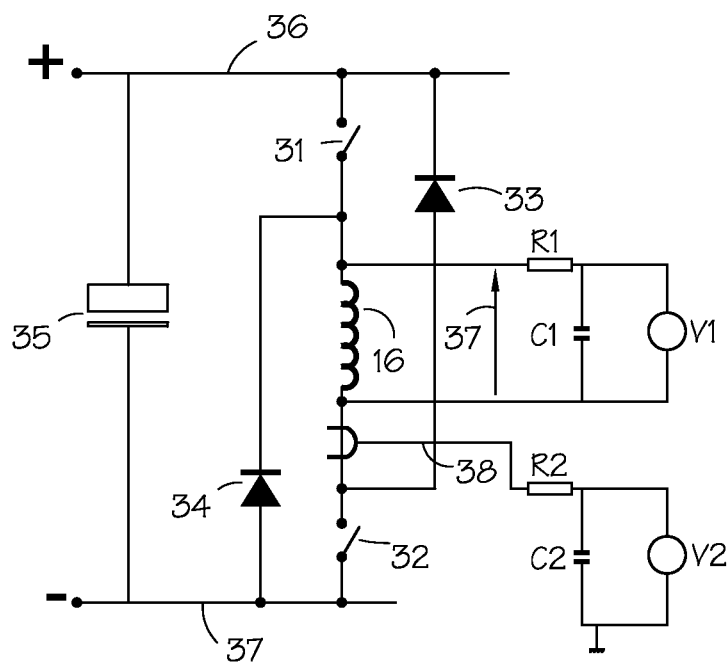
FIG. 6 shows an implementation of the circuit shown in FIG. 5 using passive analogue components in accordance with an embodiment of the disclosure.

FIG. 6 illustrates how the method can be applied as a research or development tool, for example in a laboratory context according to an embodiment. The low-pass filters 39, 40 of FIG. 5 are implemented as simple RC networks. The filter comprising R1 and C1 extracts the mean level from the time-varying voltage 37, which is displayed by V1. Similarly, the filter comprising R2 and C2 extracts the mean level from the current signal 38, which is displayed on V2 (with appropriate scaling). Here, conventional multi-purpose meters can reasonably be used for V1 and V2 to obtain the necessary readings. On their DC ranges, such meters will usually be average-responding by design, in which case the low-pass filters are apparently superfluous. However, whilst omitting the filter may be acceptable for the current measurement (where the waveform crest factor is generally modest), at least some degree of low-pass filtering is generally essential for the voltage measurement, where the peak value of the winding voltage may be tens or even hundreds of times larger than the DC component. A passive filter arrangement ahead of the measurement means will reduce the crest factor of the signal and attenuate the differential and common-mode high frequency components of voltage, so that a relatively simple measurement technique can be used. In the laboratory this can be a bench digital voltmeter, and in an embedded arrangement a conventional low-bandwidth (and therefore inexpensive) differential or isolation amplifier (as examples). Such embedded arrangements will now be discussed.

Figure 7:
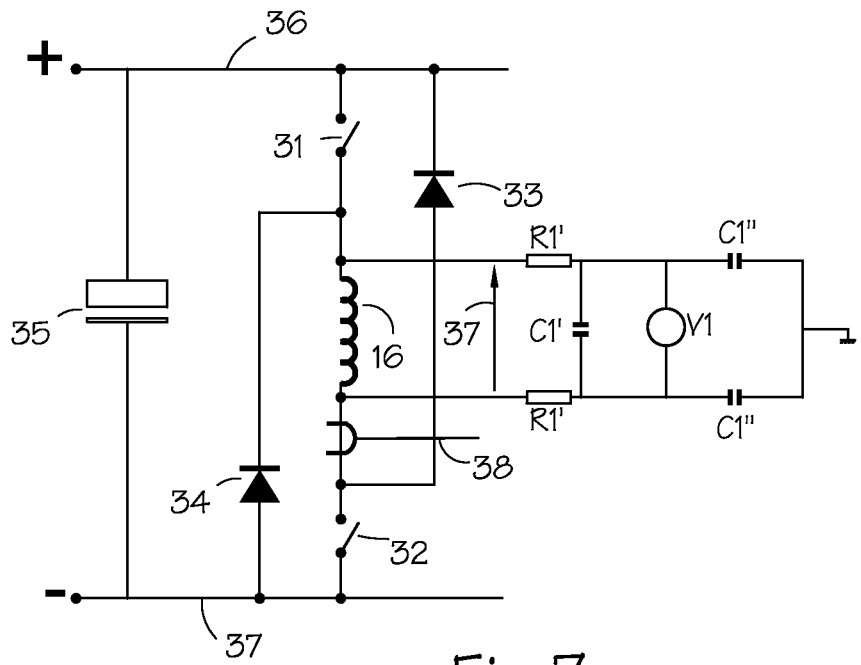
FIG. 7 shows a further implementation of the circuit shown in FIG. 5 using passive analogue components in accordance with an embodiment of the disclosure.

FIG. 7 shows an optional arrangement for the low-pass filter where R1 is split into two substantially equal portions R1' and some of the filtering capacitance is provided in a grounded connection of a further two capacitors C1". Such an arrangement can be useful in reducing the rate of change of common mode potential seen by the voltmeter V1. It will be appreciated that various other filter arrangements of this kind as known in the art are possible.

Figure 8:
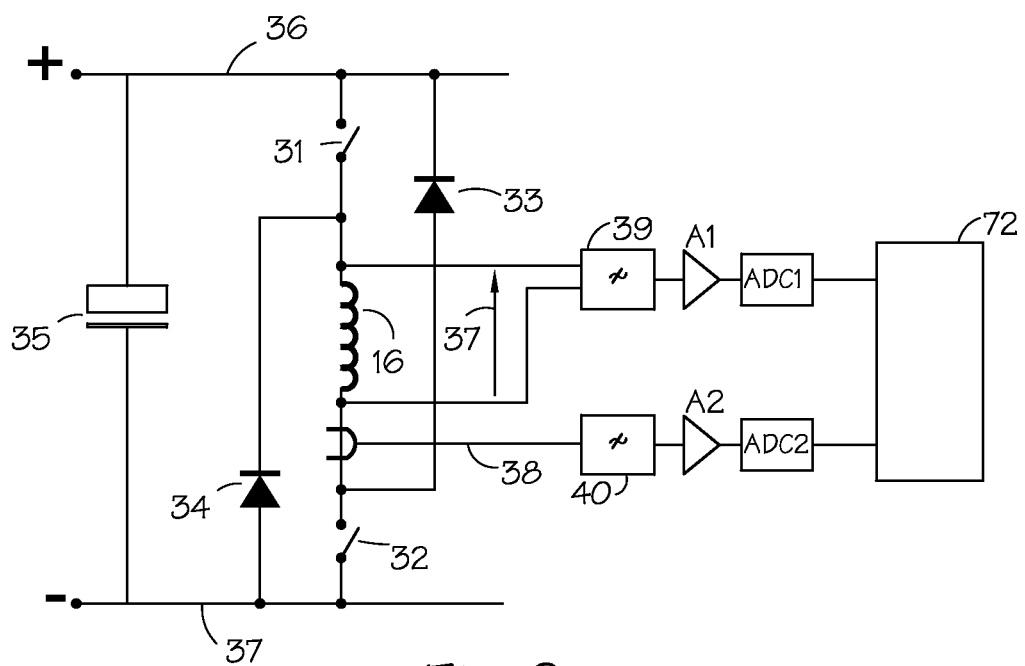
FIG. 8 shows a schematic diagram of the circuit of FIG. 5 using digital components in accordance with an embodiment of the disclosure.

FIG. 8 shows an embodiment in which the resistance calculations are assumed to be carried out in the digital domain within a microprocessor, digital signal processor or other programmable controller 72. Here, the degree of filtering carried out in the analogue domain via the low-pass filters 39,40 will depend to some extent on whether measurements of the instantaneous winding voltage and/or current are needed for other additional purposes within the controller. Signal-conditioning amplifiers are provided at A1 and A2 to provide any voltage scaling that is required. Analogue to digital converters are provided at ADC1 and ADC2 and the digital signals are passed to the processor 72.

Those skilled in the art of electrical measurement will realise that the crest factor of the winding voltage is large in this type of electrical machine and therefore the digitising of an unfiltered waveform must preserve the relatively small mean value with sufficient accuracy. The sampling rate of the analogue to digital conversion must also be taken into account to prevent errors due to aliasing becoming significant.

Figure 9:
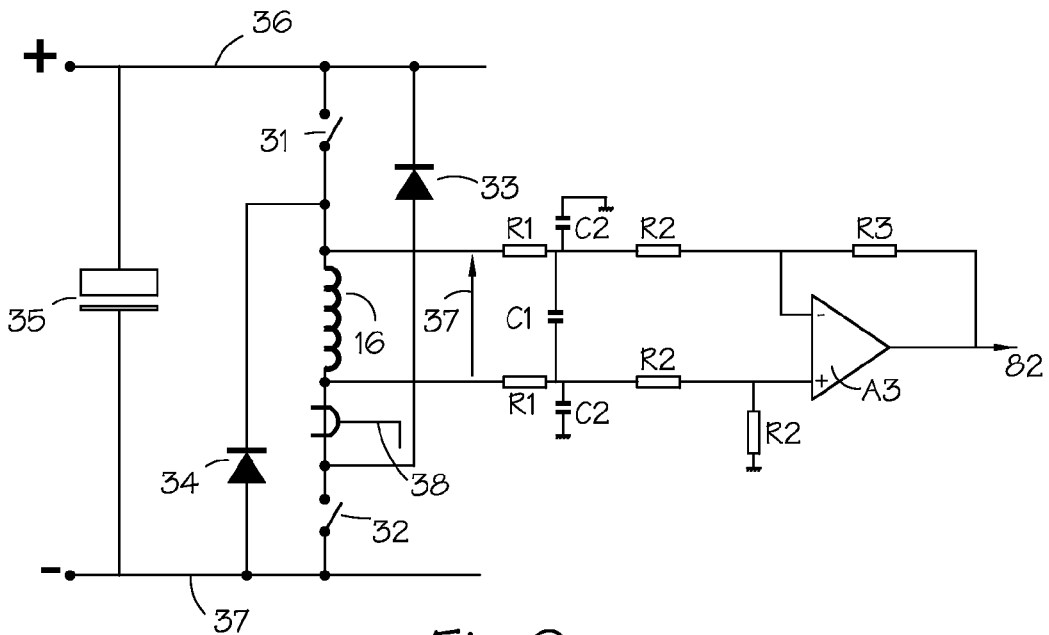
FIG. 9 shows an embodiment using a differential amplifier.

FIG. 9 shows a further embodiment of voltage filtering and scaling arrangements which could be used to implement the low-pass filter and A1 of FIG. 8. Here a conventional differential amplifier is used in conjunction with a simple passive low-pass filter—the latter allows the use of a relatively low bandwidth and therefore low-cost operational amplifier for A3. Again the choice of filter cut-off frequency and amplifier scaling factor depends on whether the filtered voltage is to be used only for resistance estimation (in which case a long filter time constant could be used) or alternatively whether a higher bandwidth signal is needed for other purposes, in which case additional low-pass filtering may be applied in subsequent signal processing not shown here.

Figure 10:
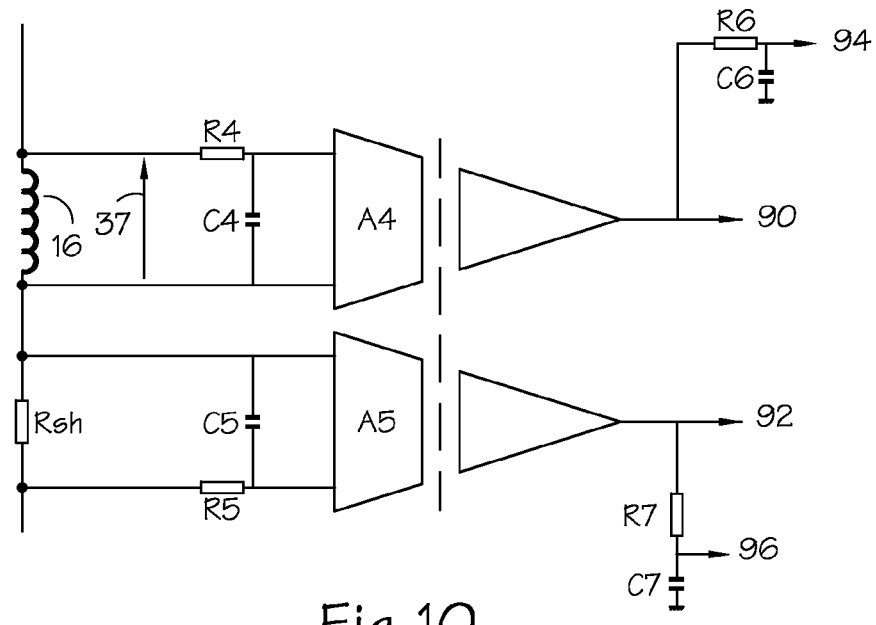
FIG. 10 shows an embodiment using isolation amplifiers.

FIG. 10 shows a further embodiment in which isolation amplifiers are used, again with some degree of analogue pre-filtering to minimise the bandwidth requirements and common-mode stresses that the isolation amplifiers must support. For illustration, a resistive shunt Rsh has been shown for current measurement in place of the previously shown isolated current sensor. The low-pass filter constituted by R4 and C4 feeds the isolation amplifier A4 which outputs a signal proportional to the mean winding voltage at point 90. Similarly, the low-pass filter constituted by R5 and C5 feeds the isolation amplifier A5 which outputs a signal proportional to the mean winding current at point 92. FIG. 10 also shows the alternative provision of additional low-pass filtering on the outputs of the amplifiers, should the bandwidths determined in this example by R4, C4 and/or R5, C5 be higher than required for the dividing circuit which would produce the resistance estimate. These optional outputs are available at points 94 and 96.

Figure 11:
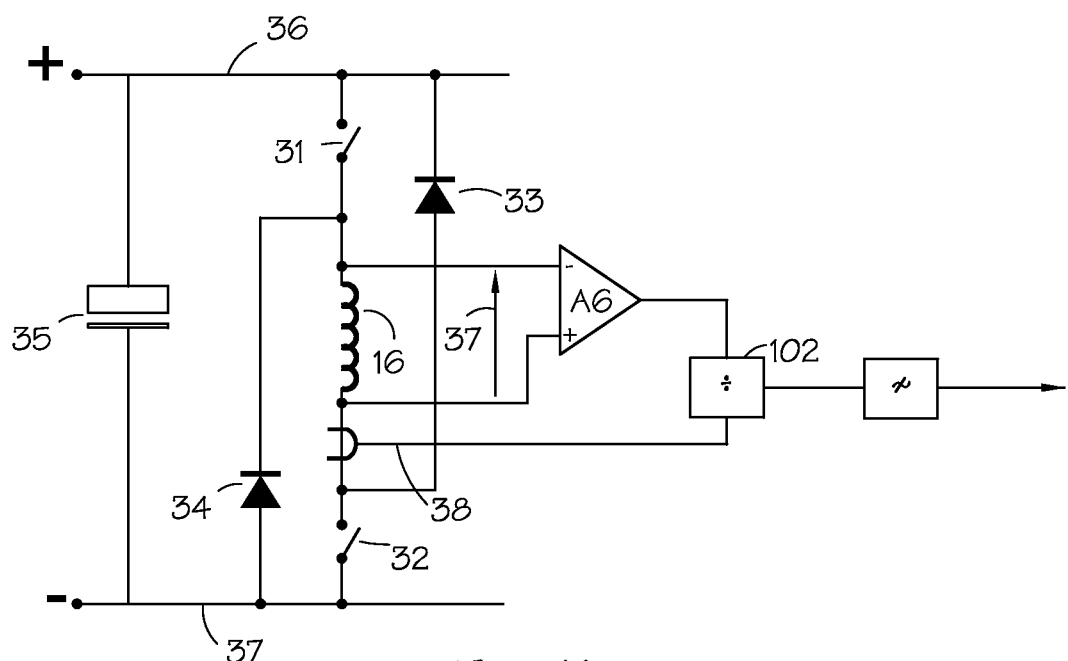
FIG. 11 shows an alternative embodiment.

FIG. 11 shows an alternative embodiment in which the ratio of unfiltered voltage and current is calculated prior to low-pass filtering. This method is not preferred for two reasons. Firstly it is fundamentally flawed, because additional DC components can be created in the result as a result of the ratio of purely AC components in the voltage and current. Secondly, as a purely practical matter, A6 and the division means 102 would, as discussed earlier, have to cope with the very large crest factor of the voltage waveform whilst at the same time accurately resolving the much smaller DC (zero frequency) component.

Figure 1:
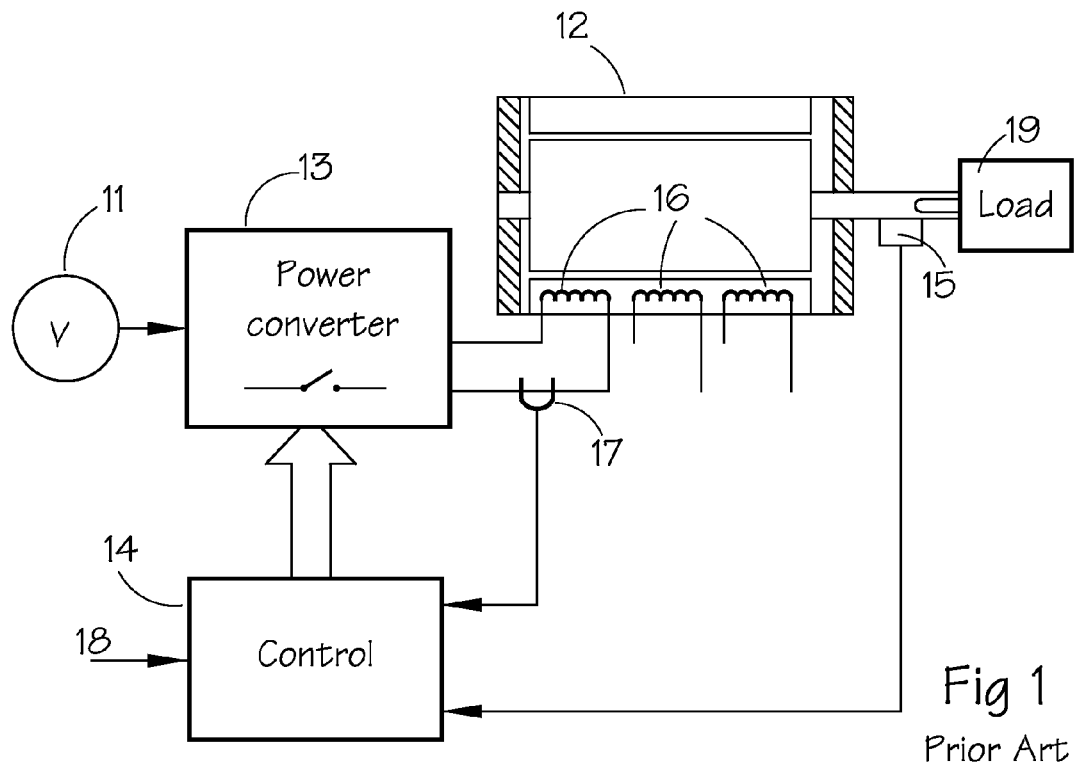
FIG. 1 shows the principal components of a switched reluctance drive system.
Figure 2:
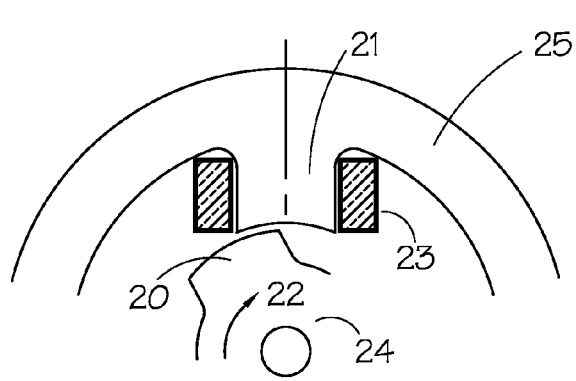
FIG. 2 shows a schematic diagram of a rotor pole approaching a stator pole.
Figure 3:
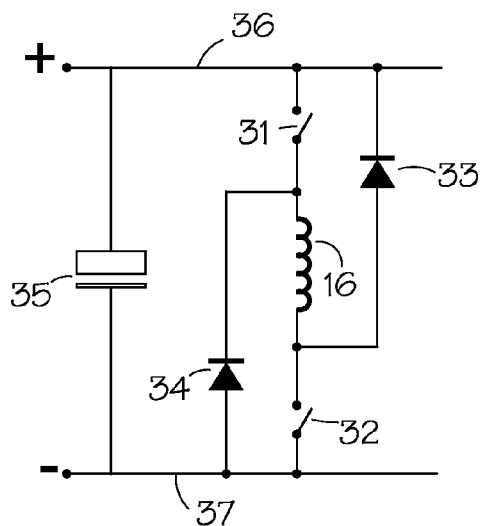
FIG. 3 shows typical switching circuitry in a power converter that controls the energisation of the phase windings of the machine of FIG. 1.
Figure 4A:
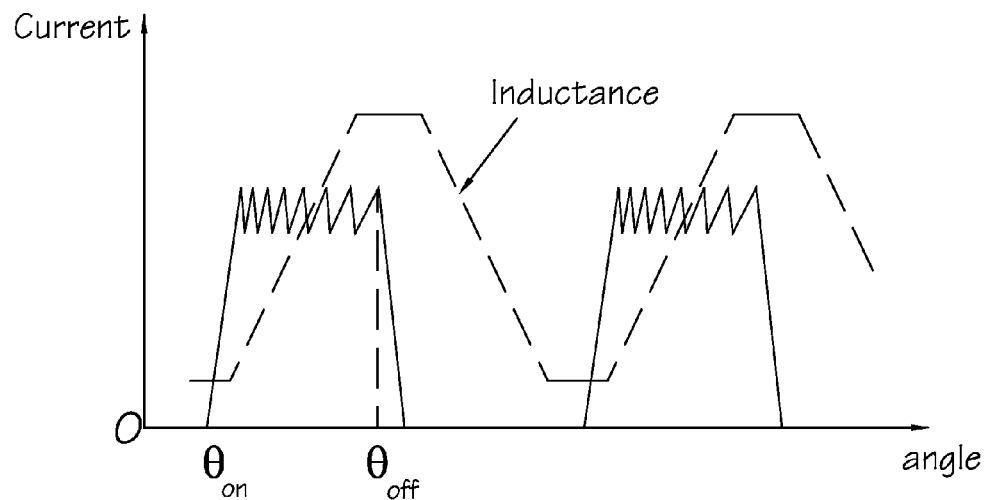
FIGS. 4(a) and 4(b) illustrate typical current waveforms of a switched reluctance drive operating in chopping and single-pulse modes respectively.
Figure 4B:
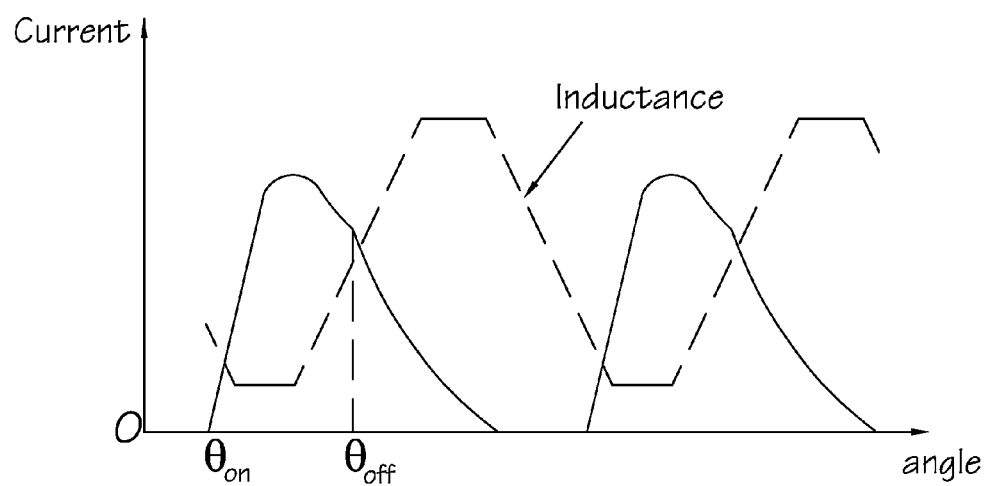

In practice, it is convenient to put the circuitry associated with this disclosure in the enclosure which contains the power converter (ie 13 in FIG. 1). Generally, in the resulting resistance estimate, the resistance of any cable between motor and electronics is indistinguishable from the winding resistance of the machine. If there is a substantial distance between the power electronics and the machine 12, the cable resistance will be significant with respect to the winding resistance and it will be necessary to make some allowance for it in the resistance and temperature calculations. For example, the cable resistance could be estimated from design calculations or measured prior to operation of the drive and that value simply subtracted from the estimate of the total resistance. Another method, which eliminates the effect of the cable resistance, would be to run a separate pair of voltage sensing wires from the motor terminals to the other parts of the resistance estimating circuit. A yet further method is to include the filter in the motor terminal box, so reducing the voltage levels, high frequency interference issues and short-circuit current capability on the temperature sensing cable.

It will be appreciated that the various current and voltage measurement arrangements illustrated above can be used in many permutations, in addition to those shown here, and also that other similar means and arrangements could be used without departing from the spirit and scope of the invention.

While the present disclosure is particularly suitable for use in switched reluctance drive systems, which include a switched reluctance machine, it will be realised that the disclosure can be applied to any electrical machine with any number of poles and any lamination geometry, whether operated as a motor or generator, provided that it has unidirectional excitation applied to at least one of the windings. Similarly, the disclosure could be applied to a linear machine where the moving part (often referred to as a "rotor") travels linearly. Thus, the skilled person will appreciate that variations of the disclosed arrangements are possible without departing from the spirit and scope of the invention. Accordingly, the above description of several embodiments is made by way of example and not for the purposes of limitation. The present invention is intended to be limited only by the following claims.

What is claimed is:

1. A method for estimating at least one of resistance and temperature of a winding of an electrical machine while the machine is operating, the method comprising:
    energising the winding to cause a unidirectional current to flow in the winding to operate the machine, the unidirectional current and a resulting winding voltage across the winding each having a low-frequency component with a frequency content below a limit frequency and a high-frequency component with a frequency content above the limit frequency;
    deriving a first signal indicative of a magnitude of the low-frequency component of the winding voltage;
    deriving a second signal indicative of a magnitude of the low-frequency component of the unidirectional current; and
    deriving a third signal indicative of at least one of resistance and temperature of the winding using the first and second signals.

2. The method as claimed in claim 1, wherein the energising of the winding is periodically switched on and off at a switching frequency and the limit frequency does not exceed the switching frequency.

3. The method as claimed in claim 1, in which the limit frequency is less than 10 Hz.

4. The method as claimed in claim 1, further comprising deriving the first and second signals using respective low-pass filters.

5. The method as claimed in claim 4, wherein the low-pass filters are passive filters.

6. The method as claimed in claim 1, further comprising deriving the first and second signals using digital processing.

7. A drive system comprising:
    an electrical machine comprising a winding;
    a controller configured to energise the winding to cause a unidirectional current to flow in the winding to operate the machine, the unidirectional current and a resulting winding voltage across the winding each having a low-frequency component with a frequency content below a limit frequency and a high-frequency component with a frequency content above the limit frequency;
    a voltage sensor for sensing the winding voltage;
    a current sensor for sensing the unidirectional current; and
    a temperature analyser coupled to the voltage and current sensors and configured to:
    derive a first signal indicative of a magnitude of the low-frequency component of the winding voltage;
    derive a second signal indicative of a magnitude of the low-frequency component of the unidirectional current; and
    derive a third signal indicative of at least one of resistance and temperature of the winding using the first and second signals.

8. The system as claimed in claim 7, wherein the controller is configured to periodically switch energisation of the winding on and off at a switching frequency and the limit frequency does not exceed the switching frequency.

9. The system as claimed in claim 7, in which the limit frequency is less than 10 Hz.

10. The system as claimed in claim 7, wherein the temperature analyser comprises respective low-pass filters for deriving the first and second signals.

11. The system as claimed in claim 10, wherein the low-pass filters are passive filters.

12. The system as claimed in claim 7, the temperature analyser being configured to derive the first and second signals using digital processing.

13. A system for estimating at least one of resistance and temperature of a winding of an electrical machine while the machine is operating, the system comprising:
    means for energising the winding to cause a unidirectional current to flow in the winding to operate the machine, the unidirectional current, and a resulting winding voltage across the winding, each having a low-frequency component with a frequency content below a limit frequency and a high-frequency component with a frequency content above the limit frequency;

means for deriving a first signal indicative of a magnitude of the low-frequency component of the winding voltage;

means for deriving a second signal indicative of a magnitude of the low-frequency component of the unidirectional current; and means for deriving a third signal indicative of at least one of resistance and temperature of the winding using the first and second signals.

14. The system as claimed in claim 13, wherein the means for energising is configured to periodically switch energisation of the winding on and off at a switching frequency and the limit frequency does not exceed the switching frequency.

15. The system as claimed in claim 13, in which the limit frequency is less than 10 Hz.

16. The system as claimed in claim 13, wherein the means for deriving the first and second signals comprises respective low-pass filters.

17. The system as claimed in claim 16, wherein the low-pass filters are passive filters.

18. The system as claimed in claim 13, wherein the means for deriving the first and second signals use digital processing to derive the first and second signals.

* * * * *